(12) United States Patent
Sasaki

(10) Patent No.: US 8,270,201 B2
(45) Date of Patent: Sep. 18, 2012

(54) SEMICONDUCTOR MEMORY DEVICE AND METHOD OF OPERATING THE SAME

(75) Inventor: Takahiko Sasaki, Nerima-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 149 days.

(21) Appl. No.: 12/885,815

(22) Filed: Sep. 20, 2010

(65) Prior Publication Data

US 2011/0157958 A1    Jun. 30, 2011

(30) Foreign Application Priority Data

Dec. 24, 2009    (JP) .................................. 2009-292359

(51) Int. Cl.
*G11C 11/00* (2006.01)
(52) U.S. Cl. ........................................ 365/148; 365/163
(58) Field of Classification Search .................. 365/148, 365/163

See application file for complete search history.

(56) References Cited

U.S. PATENT DOCUMENTS

| 7,190,607 | B2 * | 3/2007 | Cho et al. | 365/148 |
| 2010/0054019 | A1 * | 3/2010 | Toda | 365/148 |
| 2010/0309715 | A1 * | 12/2010 | Choi | 365/163 |

FOREIGN PATENT DOCUMENTS

JP    2008-91025    4/2008

OTHER PUBLICATIONS

U.S. Appl. No. 13/051,766, filed Mar. 18, 2011, Sasaki.
U.S. Appl. No. 13/051,312, filed Mar. 18, 2011, Sasaki, et al.
U.S. Appl. No. 13/051,110, filed Mar. 18, 2011, Sasaki.
U.S. Appl. No. 13/043,681, filed Mar. 9, 2011, Kurosawa, et al.
U.S. Appl. No. 13/033,151, filed Feb. 23, 2011, Sasaki, et al.

\* cited by examiner

*Primary Examiner* — Anh Phung
(74) *Attorney, Agent, or Firm* — Oblon, Spivak, McClelland, Maier & Neustadt, L.L.P.

(57) ABSTRACT

According to one embodiment, a semiconductor memory device comprises a memory cell array and a control circuit. The control circuit applies a certain potential difference to a selected one of the memory cells. The control circuit comprises a current mirror circuit, a reference current generating circuit, and a detecting circuit. The current mirror circuit produces a mirror current having a current value identical to that of a cell current flowing in the selected one of the memory cells. The reference current generating circuit produces a reference current, the reference current having a current value that differs from the current value of the mirror current by a certain current value. The detecting circuit detects transition of a resistance state of the selected one of the memory cells based on a magnitude relation of the mirror current and the reference current.

20 Claims, 7 Drawing Sheets

SEMICONDUCTOR MEMORY DEVICE AND METHOD OF OPERATING THE SAME

CROSS-REFERENCE TO RELATED APPLICATIONS

This application is based upon and claims the benefit of priority from prior Japanese Patent Application No. 2009-292359, filed on Dec. 24, 2009, the entire contents of which are incorporated herein by reference.

BACKGROUND

1. Field

Embodiments described herein relate generally to a semiconductor memory device and a method of operating the semiconductor memory device.

2. Description of the Related Art

In recent years, resistance varying memory devices employing a variable resistor as a memory element are attracting attention as candidates to succeed flash memory. The resistance varying memory devices are assumed here to include not only the narrowly-defined resistance varying memory (ReRAM: Resistive RAM), in which a transition metal oxide is used as a recording layer to store a resistance state of the transition metal oxide in a non-volatile manner, but also the likes of phase change memory (PCRAM: Phase Change RAM), in which chalcogenide or the like is used as a recording layer to utilize resistance information of a crystalline state (conductor) and an amorphous state (insulator).

There are known to be two kinds of operation modes in memory cells of a resistance varying memory device. In one, referred to as bipolar type, the polarity of applied voltage is switched to set a high-resistance state and a low-resistance state. In the other, referred to as unipolar type, the voltage value and voltage application time are controlled, thus allowing the high-resistance state and the low-resistance state to be set without switching the polarity of applied voltage.

This is explained as follows taking the case of unipolar type ReRAM as an example. Write of data to the memory cell is performed by applying a certain voltage to the variable resistor for a short time. This causes the variable resistor to change from the high-resistance state to the low-resistance state. This operation to change the variable resistor from the high-resistance state to the low-resistance state is hereinafter referred to as a setting operation. On the other hand, erase of data in the memory cell is performed by applying a certain voltage to the variable resistor for a long time, the certain voltage being lower than that applied during the setting operation, and the variable resistor being in the low-resistance state subsequent to the setting operation. This causes the variable resistor to change from the low-resistance state to the high-resistance state. This operation to change the variable resistor from the low-resistance state to the high-resistance state is hereinafter referred to as a resetting operation. The memory cell adopts, for example, the high-resistance state as a stable state (reset state), and, in the case of binary data storage, write of data is performed by the setting operation in which the reset state is changed to the low-resistance state.

Now, in the case that an operation is executed on the memory cell to change its resistance state, application of the operation voltage must be suspended subsequent to the resistance state of the variable resistor in the memory cell changing. Detection of change in the resistance value of the variable resistor is ordinarily performed using the change in the cell current flowing in the memory cell. Conventionally, a certain reference current is prepared, and the change in the resistance value of an element is detected by detecting that magnitudes of the current value of the cell current flowing in the element and the current value of the reference current are reversed. It is difficult to achieve uniformity in characteristics of variable resistors employed in memory cells, and the resistance value of a variable resistor subsequent to an operation varies for each memory cell. The reference current must be determined with a considerable margin, taking dispersion in the resistance value of the variable resistors into consideration. This leads to difficulties in determining the reference current employed for detecting whether or not the resistance state of a selected memory cell has shifted. There is a problem that, when the current value of the reference current deviates from that of the cell current flowing in the selected memory cell prior and subsequent to the operation, change in the resistance state cannot be detected, and the operation cannot be terminated normally.

DETAILED DESCRIPTION

A semiconductor memory device in accordance with an embodiment comprises a memory cell array and a control circuit. The memory cell array has memory cells disposed at intersections of a plurality of first lines and a plurality of second lines, each of the memory cells being configured by a rectifier and a variable resistor connected in series. The control circuit applies a first voltage to a selected one of the first lines and applies a second voltage having a voltage value smaller than that of the first voltage to a selected one of the second lines, such that a certain potential difference is applied to a selected one of the memory cells disposed at the intersection of the selected one of the first lines and the selected one of the second lines. The control circuit comprises a current mirror circuit, a reference current generating circuit, and a detecting circuit. The current mirror circuit produces a mirror current having a current value identical to that of a cell current flowing in the selected one of the memory cells. The reference current generating circuit produces a reference current, the reference current having a current value that differs from the current value of the mirror current by a certain current value, and having a timing of change that is delayed compared with that of the mirror current. The detecting circuit detects transition of a resistance state of the selected one of the memory cells based on a magnitude relation of the mirror current and the reference current. The control circuit suspends voltage application to the selected one of the first lines and the selected one of the second lines based on a detection result of the detecting circuit.

A semiconductor memory device in accordance with embodiments of the present invention is described below with reference to the drawings.

First Embodiment

Figure 1:
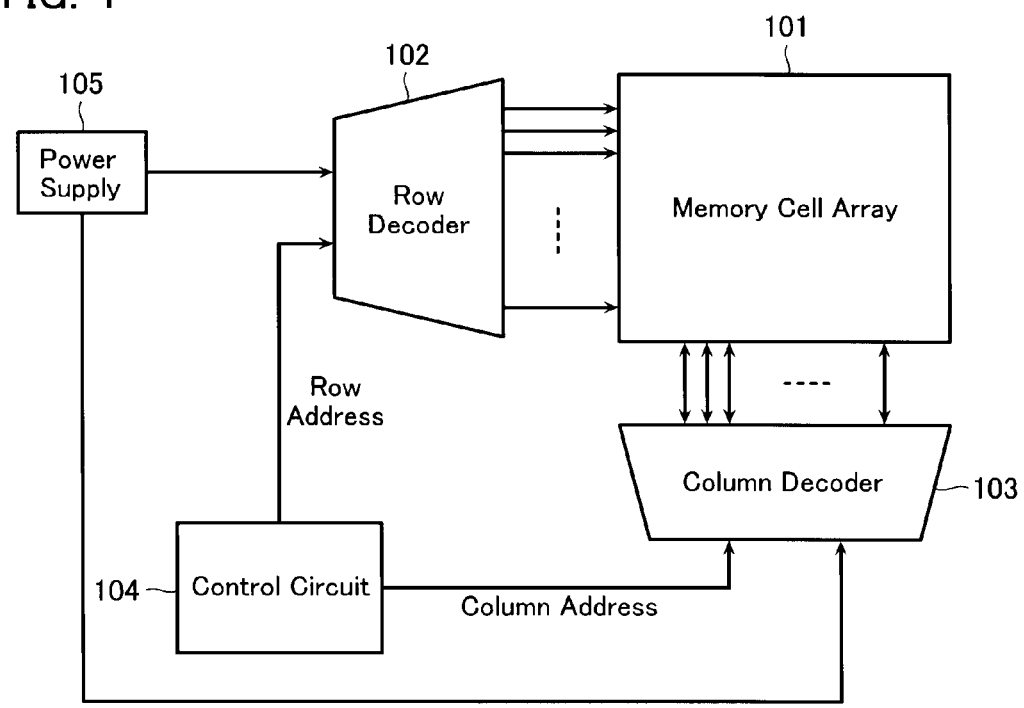
FIG. 1 is a block diagram of a semiconductor memory device in accordance with a first embodiment.

Configuration of Semiconductor Memory Device in Accordance with First Embodiment FIG. 1 is a block diagram of a semiconductor memory device in accordance with an embodiment of the present invention. This semiconductor memory device includes a plurality of word lines and a plurality of bit lines intersecting these word lines, and includes a memory cell array 101 having memory cells disposed at each of intersections of the word lines and bit lines. In addition, the semiconductor memory device comprises a row decoder 102 for selecting the word lines, and a column decoder 103 for selecting the bit lines. Moreover, the semiconductor memory device comprises a control circuit 104 configured to apply, respectively, a row address and a column address to the row decoder 102 and the column decoder 103 and to select a memory cell in the memory cell array 101 on which write and read are to be performed. The control circuit 104 controls start and finish of operations on the selected memory cell based on a state of the selected memory cell. A power supply 105 generates combinations of certain voltages appropriate to each of operations of read, write, and erase, and supplies these to the row decoder 102 and column decoder 103.

Figure 2:
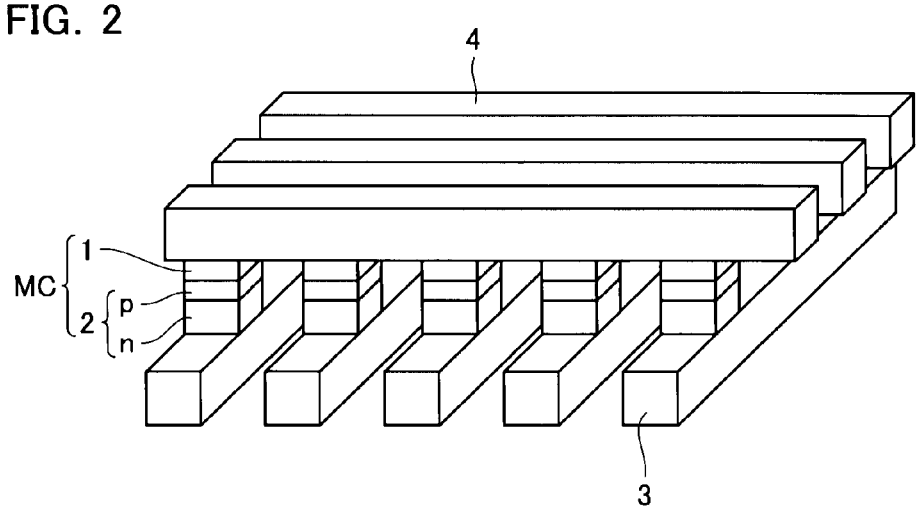
FIG. 2 is a perspective view showing a part of a memory cell array of the semiconductor memory device in accordance with the first embodiment.

FIG. 2 is a perspective view showing a part of the memory cell array 101 shown in FIG. 1. The memory cell array 101 comprises a plurality of word lines 3 disposed in parallel, and a plurality of bit lines 4 disposed in parallel to intersect these word lines 3. Disposed at each of the intersections of the word lines 3 and bit lines 4 is a unipolar type memory cell MC. The memory cell MC is configured from a variable resistor 1, which transits at least two resistance states of a low-resistance state and a high-resistance state, and a selector element, for example, a diode 2, configured from a non-ohmic element. Note that the present invention is not limited to the unipolar type memory cell MC, and may also be applied to a semiconductor memory device including a bipolar type memory cell MC. The semiconductor memory device of the embodiment shown in FIG. 2 has a so-called cross-point configuration.

In the case of this configuration, the word lines 3 and bit lines 4 form a simple line-and-space pattern, and, since it is sufficient for the word lines 3 and bit lines 4 to have a positional relationship of being orthogonal, there is no need to consider misalignment in a word line 3 direction and bit line 4 direction. Consequently, alignment accuracy in the memory cell array in manufacturing processes can be greatly relaxed, enabling manufacture to be easily performed.

Employable as the variable resistor 1 are, for example, one in which the resistance value is varied by phase transition between a crystalline state and an amorphous state such as chalcogenide or the like (PCRAM), one in which the resistance value is varied by depositing metal cations to form a contacting bridge between electrodes and ionizing the deposited metal to destroy the contacting bridge (CBRAM), and one in which the resistance value varies by voltage or current application (ReRAM) (broadly divided into one in which resistance variation occurs due to the presence or absence of charge trapped in a charge trap existing at an electrode interface, and one in which resistance variation occurs due to the presence or absence of a conducting path arising from oxygen deficiency or the like). In particular, in the case of ReRAM, the following may be employed, namely, $ZnMn_2O_4$, NiO, $TiO_2$, $SrZrO_3$, $Pr_{0.7}Ca_{0.3}MnO_3$, and so on.

In the case of unipolar type ReRAM, write of data to the memory cell MC is performed by applying the variable resistor 1 with, for example, a voltage of 3.5 V (in practice, about 4.5 V, if a voltage drop portion of the diode 2 is included) and a current of about 10 nA for a time of about 10 ns-100 ns. This causes the variable resistor 1 to change from the high-resistance state to the low-resistance state (setting operation).

On the other hand, erase of data in the memory cell MC is performed by applying the variable resistor 1, which is in the low-resistance state subsequent to the setting operation, with a voltage of 0.8 V (in practice, about 2.0 V, if a voltage drop portion of the diode 2 is included) and a current of about 1 µA-10 µA for a time of about 500 ns-2 µs. This causes the variable resistor 1 to change from the low-resistance state to the high-resistance state (resetting operation).

A read operation of the memory cell MC is performed by applying the variable resistor 1 with a voltage of 0.4 V (in practice, about 1.4 V, if a voltage drop portion of the diode 2 is included) and monitoring the current flowing via the variable resistor 1 using a sense amplifier. This allows it to be determined whether the variable resistor 1 is in the low-resistance state or the high-resistance state.

The bit lines of the memory cell array 101 shown in FIG. 1 are applied with voltages corresponding to each of the above-mentioned operations via the column decoder 103 based on the address sent from the control circuit 104.

When executing the setting operation or resetting operation on the memory cell MC, dispersion in the resistance value of the variable resistor 1 makes it difficult to set a reference current for detecting a state of change in the resistance value. There is a problem that, when the current value of the reference current deviates from that of the cell current flowing in a selected memory cell MC prior and subsequent to the setting operation or resetting operation, termination of the setting operation or resetting operation cannot be detected, and the operation cannot be terminated normally. A configuration of the control circuit 104 for reliably detecting change in the resistance state of a selected memory cell MC and thereby terminating the setting operation or resetting operation in a semiconductor memory device that includes the memory cells MC employing the variable resistor 1 is described below.

Termination of application of the setting voltage or resetting voltage in the semiconductor memory device of the present embodiment is controlled by the control circuit 104 shown in FIG. 1. The control circuit 104 controls the row decoder 102 and the column decoder 103 to apply a voltage to a selected bit line and thereby execute the setting operation or resetting operation on a selected memory cell MC. In addition, the control circuit 104 controls the row decoder 102 and the column decoder 103 to terminate application of the voltage when the setting operation or resetting operation on the selected memory cell MC is terminated. A configuration for controlling the row decoder 102 and the column decoder 103 to terminate application of the voltage when the setting operation or resetting operation on the selected memory cell MC is terminated is described below.

Figure 3:
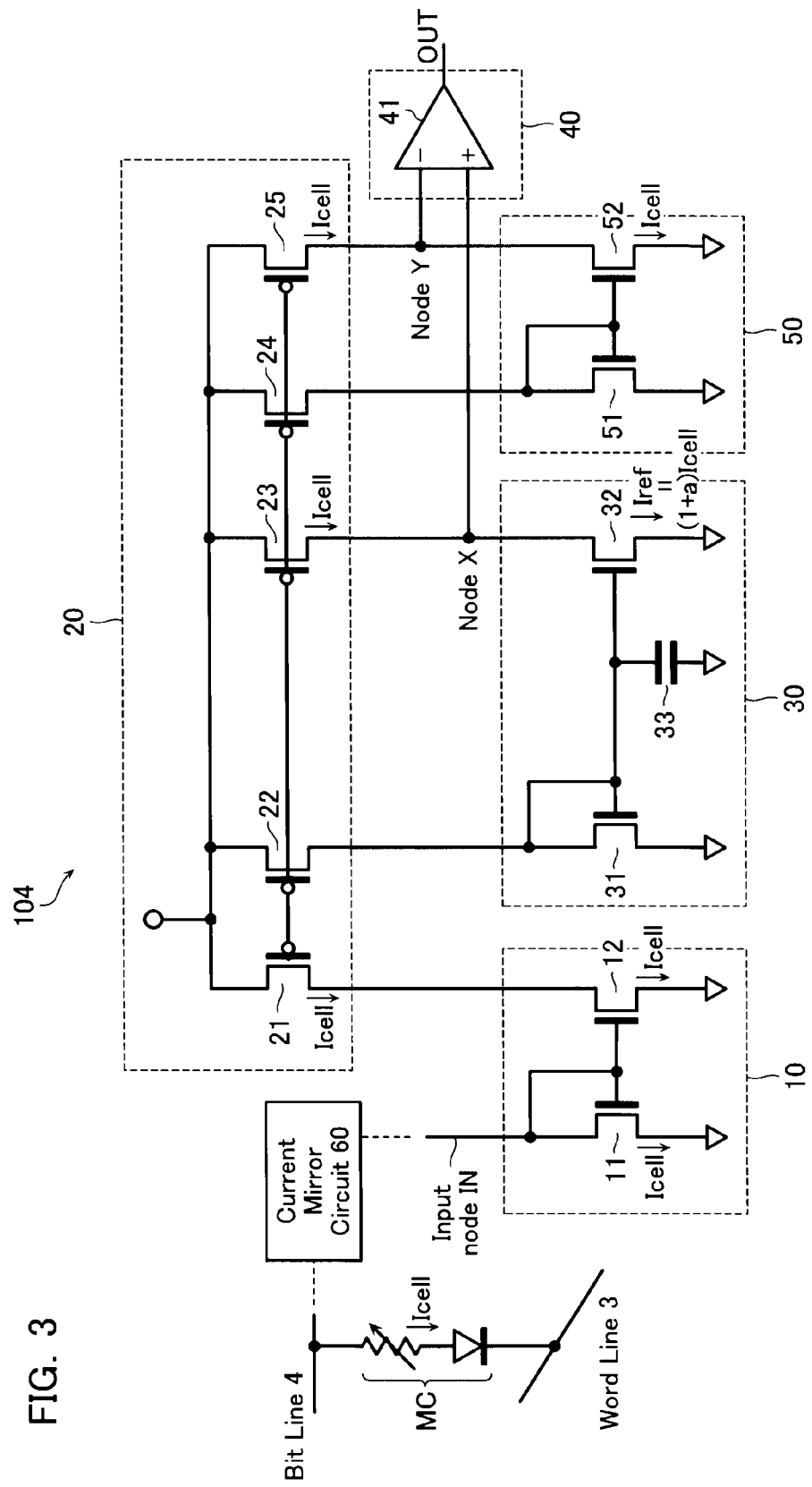
FIG. 3 is a circuit diagram of a control circuit of the semiconductor memory device in accordance with the first embodiment.

FIG. 3 is a circuit diagram of the control circuit 104 of the semiconductor memory device in accordance with the present embodiment. The control circuit 104 comprises a current mirror circuit 10, a current mirror circuit 20, a reference current generating circuit 30, a detecting circuit 40, and a current mirror circuit 50.

Flowing into an input node IN of the control circuit 104 via a certain current mirror circuit 60 is a current having a current value identical to that of a cell current Icell flowing in a selected memory cell MC of the memory cell array 101.

The input node IN is connected to the current mirror circuit 10. The current mirror circuit 10 is configured having two NMOS transistors 11 and 12 current mirror-connected. The NMOS transistor 11 has its drain and gate connected to the input node IN, and its source grounded. Further, the NMOS transistor 12 has its gate connected to the input node IN and the gate of the NMOS transistor 11, and its source grounded. This causes the cell current Icell to flow from the drain to the source of the NMOS transistors 11 and 12.

The NMOS transistor 12 has its drain connected to the current mirror circuit 20. The current mirror circuit 20 is configured having PMOS transistors 21, 22, 23, 24, and 25 which are connected in a current-mirror manner, and a power supply. The PMOS transistor 21 has its drain connected to the drain of the NMOS transistor 12. The PMOS transistors 21, 22, 23, 24, and 25 have their sources each connected to the power supply, and their gates commonly connected. This causes a current having a current value identical to that of the cell current Icell flowing in the PMOS transistor 21 to flow also in the other PMOS transistors 22-25. The cell current Icell flows from the drain of the PMOS transistor 23 towards a node X and from the drain of the PMOS transistor 25 towards a node Y.

The drain of the PMOS transistor 22 and node X are connected to the reference current generating circuit 30. The reference current generating circuit 30 is configured having two NMOS transistors 31 and 32 current mirror-connected. The NMOS transistor 31 has its drain and gate connected to the drain of the PMOS transistor 22, and its source grounded. Further, the NMOS transistor 32 has its gate connected to the drain of the PMOS transistor 22 and the gate of the NMOS transistor 31, and its source grounded. Moreover, the NMOS transistor 32 has its drain connected to node X. This causes a reference current Iref to flow from the drain to the source of the NMOS transistor 32.

Now, the NMOS transistor 32 is formed having a transistor size greater than that of the other NMOS transistors 11, 12, 31, and so on. As a result, the current value of the reference current Iref flowing in the NMOS transistor 32 has a current value greater than that of cell current Icell flowing in the other NMOS transistors 11, 12, and so on. For example, the current value of the reference current Iref is set to be (1+a) Icell (here, 0<a).

In addition, one of the terminals of a capacitor 33 is connected to the connected gates of the NMOS transistors 31 and 32. The other of the terminals of the capacitor 33 is grounded.

Node X and node Y are connected to the detecting circuit 40. The detecting circuit 40 is configured from one differential amplifier 41, the differential amplifier 41 having its inverting input terminal connected to node Y and its non-inverting input terminal connected to node X. The output signal of this differential amplifier 41 becomes an output signal OUT of the control circuit 104. A basic operation of the detecting circuit 40 is as follows. That is, while clamping the potential of the bit line 4 with a clamp transistor, the cell current Icell is caused to flow in the selected memory cell MC. The cell current Icell flows into node X, and at the same time, the reference current Iref flows out of node X via the reference current generating circuit 30. This change in potential of node X due to the difference between the cell current Icell and the reference current Iref is determined by the differential amplifier 41.

The drain of the PMOS transistor 24 and node Y are connected to the current mirror circuit 50. The current mirror circuit 50 is configured having two NMOS transistors 51 and 52 current mirror-connected. The NMOS transistor 51 has its drain and gate connected to the drain of the PMOS transistor 24, and its source grounded. Further, the NMOS transistor 52 has its gate connected to the drain of the PMOS transistor 24 and the gate of the NMOS transistor 51, and its source grounded. Moreover, the NMOS transistor 52 has its drain connected to node Y. This causes the cell current Icell to flow from the drain to the source of the NMOS transistor 52.

Operation of Semiconductor Memory Device in accordance with First Embodiment

Figure 4:
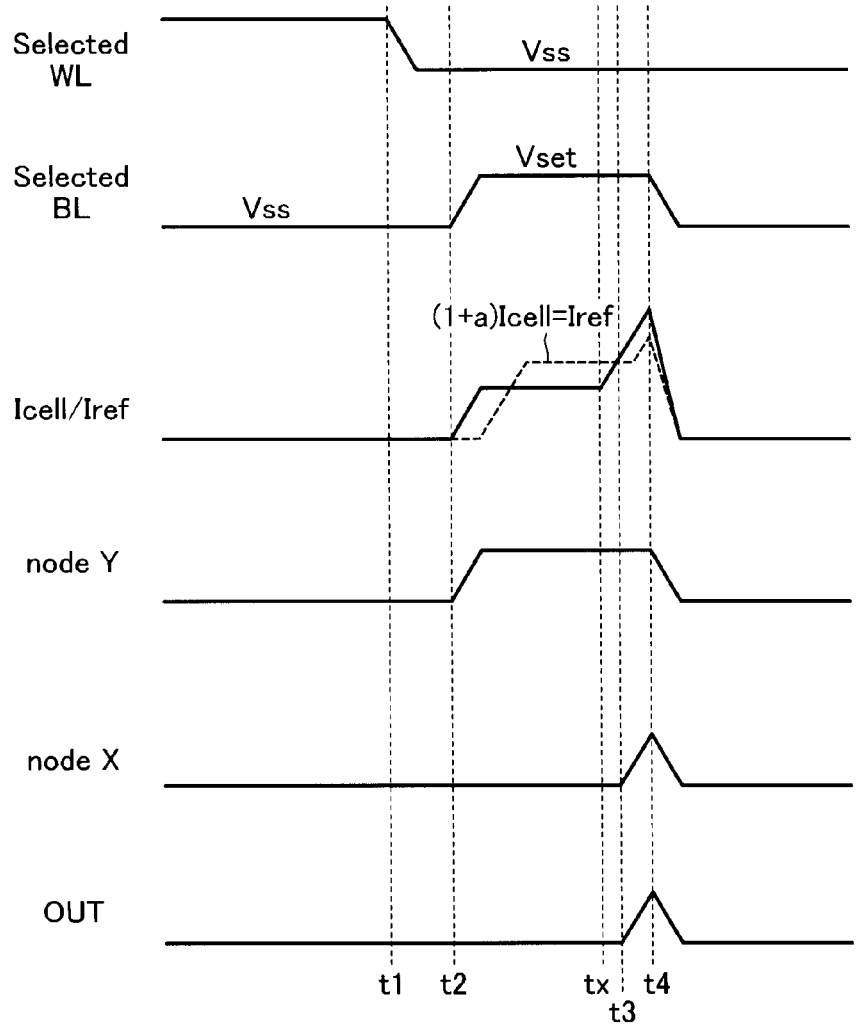
FIG. 4 is an operation waveform diagram of the control circuit of the semiconductor memory device in accordance with the first embodiment.

Next, operation of the semiconductor memory device of the present embodiment formed as above is described with reference to FIGS. 3 and 4. FIG. 4 is a waveform diagram for explaining operation of the semiconductor memory device in accordance with the present embodiment.

In operation of the semiconductor memory device, one memory cell MC connected to a selected bit line 4 and a selected word line 3 is selected from the plurality of memory cells MC provided in the memory cell array 101, and the setting operation or resetting operation are executed on that selected memory cell MC only. Operation of the control circuit 104 is described below using the example of the setting operation to transit the selected memory cell MC from the high-resistance state to the low-resistance state.

In operation of the semiconductor memory device, first, all word lines are set to "H" state, and then, at time t1, the selected word line 3 connected to the selected memory cell MC is set to "L" state, for example, a voltage Vss.

At time t2, the selected word line 3 is left at "L" state, and the selected bit line 4 is set to "H" state from "L" state (voltage Vss), and applied with a voltage required for the operation (for example, a setting voltage Vset). This voltage application to the selected bit line 4 causes the voltage to be applied to the selected memory cell MC in a forward bias direction of the diode 2 and the cell current Icell to flow in the selected memory cell MC.

The cell current Icell mirrored by the current mirror circuits 60, 10, and 20 flows in the reference current generating circuit 30. This cell current Icell causes the capacitor 33 of the reference current generating circuit 30 to be charged. After passage of a certain time, and subsequent to charging of the capacitor 33, the reference current Iref starts to flow in the NMOS transistor 32. Timing of change of the reference current Iref is delayed in comparison with that of the mirrored cell current Icell by this certain time during which the capacitor 33 is charged. As mentioned above, this reference current Iref has a current value larger than that of the cell current Icell. For example, the current value of the reference current Iref is set to (1+a) times that of the cell current Icell. The cell current Icell is mirrored also at node X, but, since the reference voltage Iref flowing out via the NMOS transistor 32 is larger, the potential of node X remains at ground potential.

On the other hand, the cell current Icell flows into node Y, and node Y is boosted to the potential of the power supply used in the current mirror circuit 20.

When the selected memory cell MC shifts from the high-resistance state to the low-resistance state at time tx due to the setting operation, the cell current Icell flowing from the selected bit line 4 to the selected word line 3 increases. Even if the cell current Icell flowing into node X at this time increases, the current value of the reference current Iref flowing via the NMOS transistor 32 is constant until the capacitor 33 of the reference current generating circuit 30 is further charged by that increased amount. Consequently, at time t3, the current value of the cell current Icell exceeds the current value of the reference current Iref. As a result, the cell current Icell flowing into node X becomes greater than the reference current flowing out of node X, and node X is thus boosted to the potential of the power supply used in the current mirror circuit 20.

At time t4, along with the change in potential of node X, the output signal OUT of the detecting circuit 40 also inverts. Voltage application to the selected bit line 4 is suspended based on this inverted output signal OUT, whereby the setting operation terminates.

Advantages of Semiconductor Memory Device in accordance with First Embodiment

In the semiconductor memory device of the present embodiment, a reference current Iref is generated to detect the change in the cell current Icell prior and subsequent to transition of the resistance state of the selected memory cell MC. The current value of this reference current Iref is determined based on the current value of the cell current Icell flowing in the selected memory cell MC prior to the resistance state of the selected memory cell MC transiting. As a result, the current value of the reference current Iref attains a current value that differs for each selected memory cell MC.

In a semiconductor memory device, dispersion in characteristics of the memory cells MC on which the operation is to be executed causes the substantive operation conditions for each of the memory cells MC to differ. If the current value of the reference current Iref is set to one particular current value for all memory cells MC, the situation may arise that, for example, the current flowing in a certain memory cell MC exceeds the reference current Iref from the start, or that, even though the operation is finished, the reference current Iref is not exceeded.

In contrast, in the semiconductor memory device of the present embodiment, a reference current Iref appropriate to the selected memory cell MC is generated for each of the selected memory cells MC, thus enabling transition of the resistance state of the selected memory cell MC to be reliably detected. It therefore becomes possible for voltage application to the memory cell MC to be suspended along with the resistance state changing, and for the operation to be reliably terminated.

Second Embodiment

Configuration of Semiconductor Memory Device in Accordance with Second Embodiment Next, a control circuit of a semiconductor memory device in accordance with a second embodiment of the present invention is described. Configuration of the memory cell array 101 and peripheral circuits, such as row decoder 102 and column decoder 103, in the semiconductor memory device of the present embodiment is similar to that of the above-described semiconductor memory device of the first embodiment.

Figure 5:
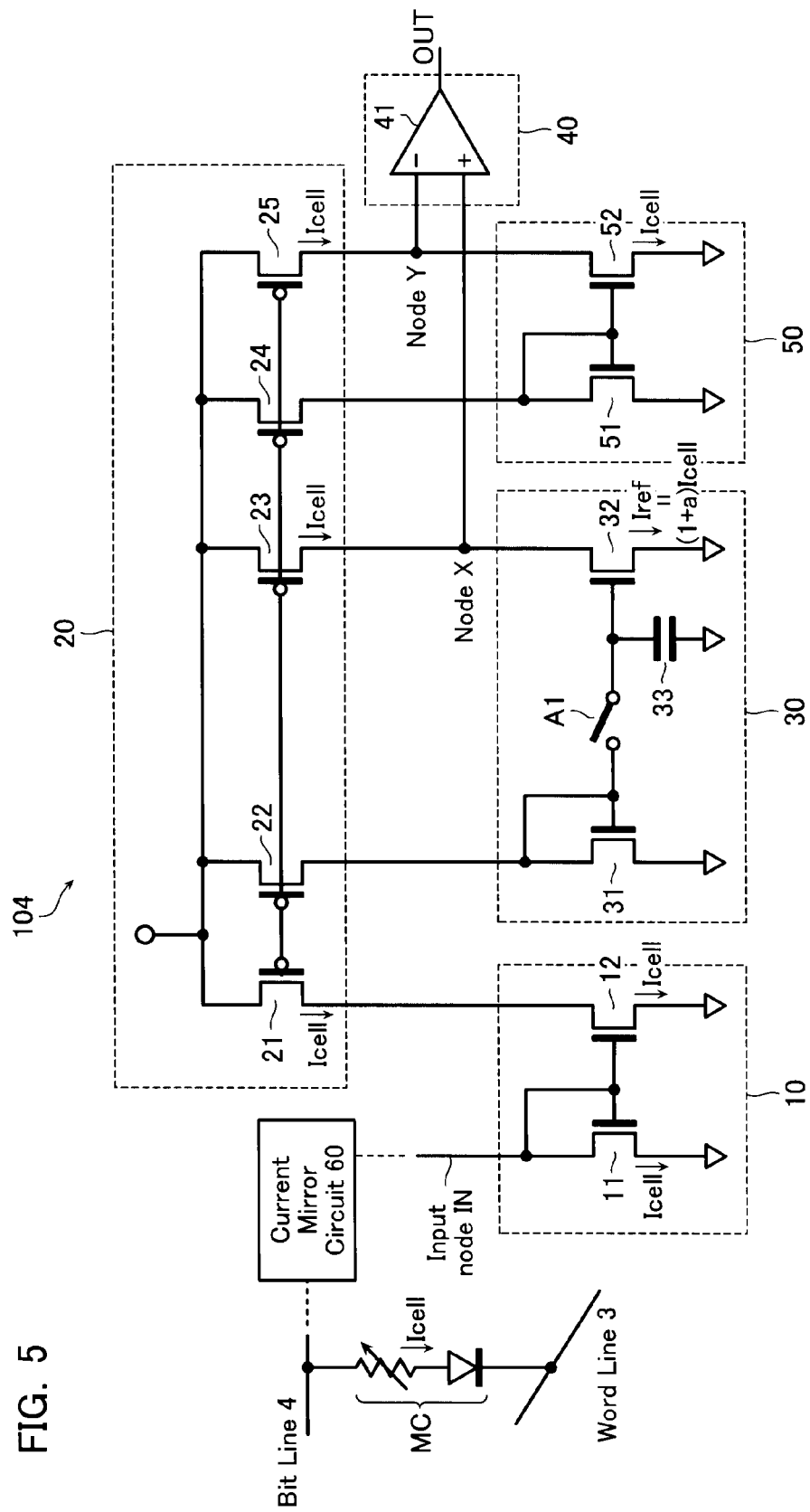
FIG. 5 is a circuit diagram of a control circuit of a semiconductor memory device in accordance with a second embodiment.

FIG. 5 is a circuit diagram of a control circuit 104 of the semiconductor memory device in accordance with the present embodiment. In this control circuit 104, identical symbols are assigned to parts having a configuration identical to that in the above-described first embodiment, thereby allowing repetitive description to be omitted.

The control circuit 104 of the semiconductor memory device in accordance with the present embodiment differs from that of the first embodiment in having a switch A1 provided in the reference current generating circuit 30 between the gate of the NMOS transistor 31 and the gate of the NMOS transistor 32. The switch A1 is configured to block inflow of the cell current Icell to the capacitor 33. This switch A1 is closed at the start of operation of the control circuit 104, and is opened subsequent to the reference current Iref beginning to flow via the NMOS transistor 32. When the switch A1 opens, the reference current generating circuit 30 continues to allow flow of the reference current Iref based on charge stored in the capacitor 33, irrespective of change in the cell current Icell. The current value of this reference current Iref is determined by transistor size of the NMOS transistor 32, and, even if the current value of the cell current Icell changes subsequent to opening of the switch A1, the current value of the reference current Iref is maintained constant. This configuration makes it possible to hold information of the current value of the reference current Iref based on the current value of the cell current Icell flowing in the selected memory cell MC at a certain time.

Operation of Semiconductor Memory Device in Accordance with Second Embodiment

Figure 6:
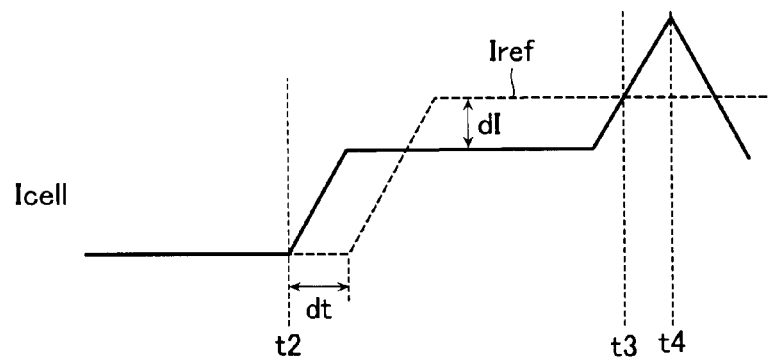
FIG. 6 is an operation waveform diagram of the control circuit of the semiconductor memory device in accordance with the embodiments.

Next, operation of the semiconductor memory device of the present embodiment formed as above is described with reference to FIG. 6. FIG. 6 is a waveform diagram for explaining operation of the semiconductor memory device in accordance with the present embodiment.

FIG. 6 is a waveform diagram for the case where the setting operation is executed on the selected memory cell MC, similarly to the operation waveform diagram shown in FIG. 4. Now, FIG. 6 shows only a current waveform diagram of the cell current Icell and the reference current Iref. Other operation waveforms are similar to the operation waveforms shown in FIG. 4, and are thus omitted.

In the case of employing the control circuit 104 shown in FIG. 5 to execute the setting operation on the selected memory cell MC, the switch A1 of the reference current generating circuit 30 is opened subsequent to the reference current Iref beginning to flow via the NMOS transistor 32. The reference current generating circuit 30 thus continues to cause the reference current Iref maintained at a constant current value to flow from node X. As a result, at time t3 and after, the current value of the reference current Iref does not change, even if the cell current Icell changes, and the control circuit 104 continues to cause the reference current Iref having a constant current value to flow from node X.

At time t3, the current value of the cell current Icell exceeds the current value of the reference current Iref, whereby the potential of node X changes, similarly to the above-described first embodiment. Along with the change in potential of node X, the output signal OUT of the detecting circuit 40 also inverts. Voltage application to the selected bit line 4 is suspended based on this inverted output signal OUT, whereby the setting operation terminates.

Advantages of Semiconductor Memory Device in Accordance with Second Embodiment

In the semiconductor memory device of the present embodiment, a reference current Iref appropriate to the selected memory cell MC is generated for each of the selected memory cells MC, thus enabling transition of the resistance state of the selected memory cell MC to be reliably detected, similarly to the first embodiment. It therefore becomes possible for voltage application to the memory cell MC to be suspended along with the resistance state changing, and for the operation to be reliably terminated.

Now, in the case of a configuration where the reference current Iref is changed to constantly accommodate to change in the cell current Icell as in the first embodiment, the following problem exists. That is, if the change in the cell current Icell due to transition of the resistance state of the memory cell MC is gradual, it becomes difficult to judge the position where the current value of the cell current Icell and the current value of the reference current Iref reverse at time t3 of FIG. 4, whereby the change in potential at node X is rendered undetectable. As a result, it becomes difficult to terminate the operation reliably.

In contrast, in the control circuit 104 of the present embodiment, the current value of the reference current Iref does not change. As a result, even if the change in the cell current Icell is gradual, the current value of the cell current Icell and the current value of the reference current Iref reliably reverse, thereby enabling the change in potential at node X to be detected. The control circuit 104 of the present embodiment allows the operation to be terminated reliably.

Third Embodiment

Configuration of Semiconductor Memory Device in Accordance with Third Embodiment Next, a control circuit of a semiconductor memory device in accordance with a third embodiment of the present invention is described. Configuration of the memory cell array 101 and peripheral circuits, such as row decoder 102 and column decoder 103, in the semiconductor memory device of the present embodiment is similar to that of the above-described semiconductor memory device of the first embodiment.

Figure 7:
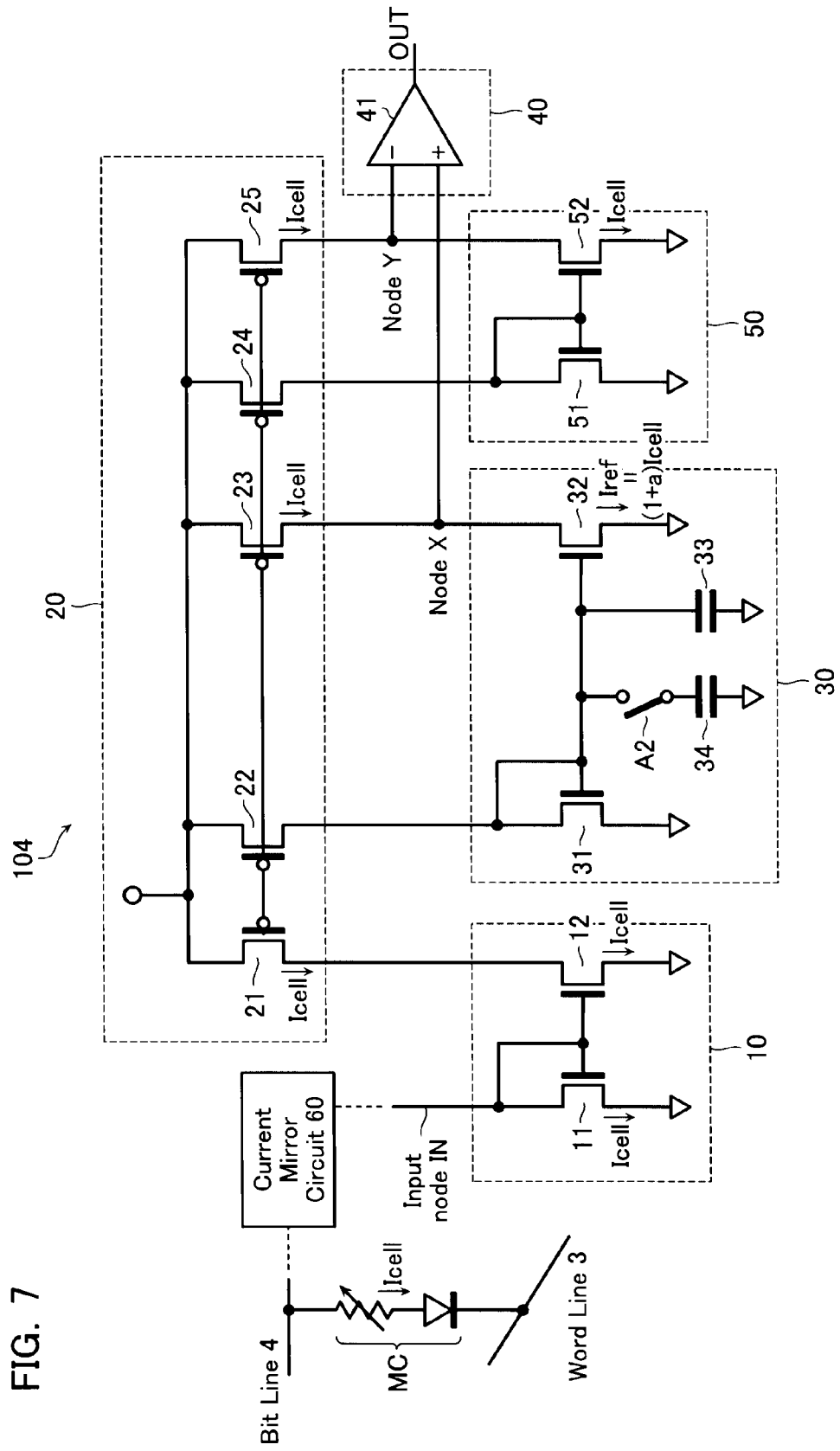
FIG. 7 is a circuit diagram of a control circuit of a semiconductor memory device in accordance with a third embodiment.

FIG. 7 is a circuit diagram of a control circuit 104 of the semiconductor memory device in accordance with the present embodiment. In this control circuit 104, identical symbols are assigned to parts having a configuration identical to that in the above-described first embodiment, thereby allowing repetitive description to be omitted.

The control circuit 104 of the semiconductor memory device in accordance with the present embodiment differs from that of the first embodiment in having a capacitor 34 further provided in the reference current generating circuit 30 along with the capacitor 33.

One of terminals of the capacitor 34 is connected via a switch A2 to the connected gates of the NMOS transistors 31 and 32. The other of the terminals of the capacitor 34 is grounded. Opening and closing of this switch A2 is controlled arbitrarily by the control circuit 104. When the switch A2 is closed, it takes a longer time for the cell current Icell to charge the capacitors 33 and 34 than to charge only the capacitor 33 in the first embodiment. On the other hand, when the switch A2 is open, it takes an identical time for the cell current Icell to charge the capacitor 33 as to charge the capacitor 33 in the first embodiment. This configuration allows the delay time between the cell current Icell beginning to flow in the selected memory cell and the reference current Iref beginning to flow to be changed arbitrarily. This means that a value of a time dt that the reference current Iref is delayed from the cell current Icell in the operation waveform diagram shown in FIG. 6 can be changed.

Advantages of Semiconductor Memory Device in Accordance with Third Embodiment

In the semiconductor memory device of the present embodiment, a reference current Iref appropriate to the selected memory cell MC is generated for each of the selected memory cells MC, thus enabling transition of the resistance state of the selected memory cell MC to be reliably detected, similarly to the first embodiment. It therefore becomes possible for voltage application to the memory cell MC to be suspended along with the resistance state changing, and for the operation to be reliably terminated. Moreover, in the control circuit of the present embodiment, timing of generating the reference current Iref can be made variable.

Fourth Embodiment

Configuration of Semiconductor Memory Device in Accordance with Fourth Embodiment Next, a control circuit of a semiconductor memory device in accordance with a fourth embodiment of the present invention is described. Configuration of the memory cell array 101 and peripheral circuits, such as row decoder 102 and column decoder 103, in the semiconductor memory device of the present embodiment is similar to that of the above-described semiconductor memory device of the first embodiment.

Figure 8:
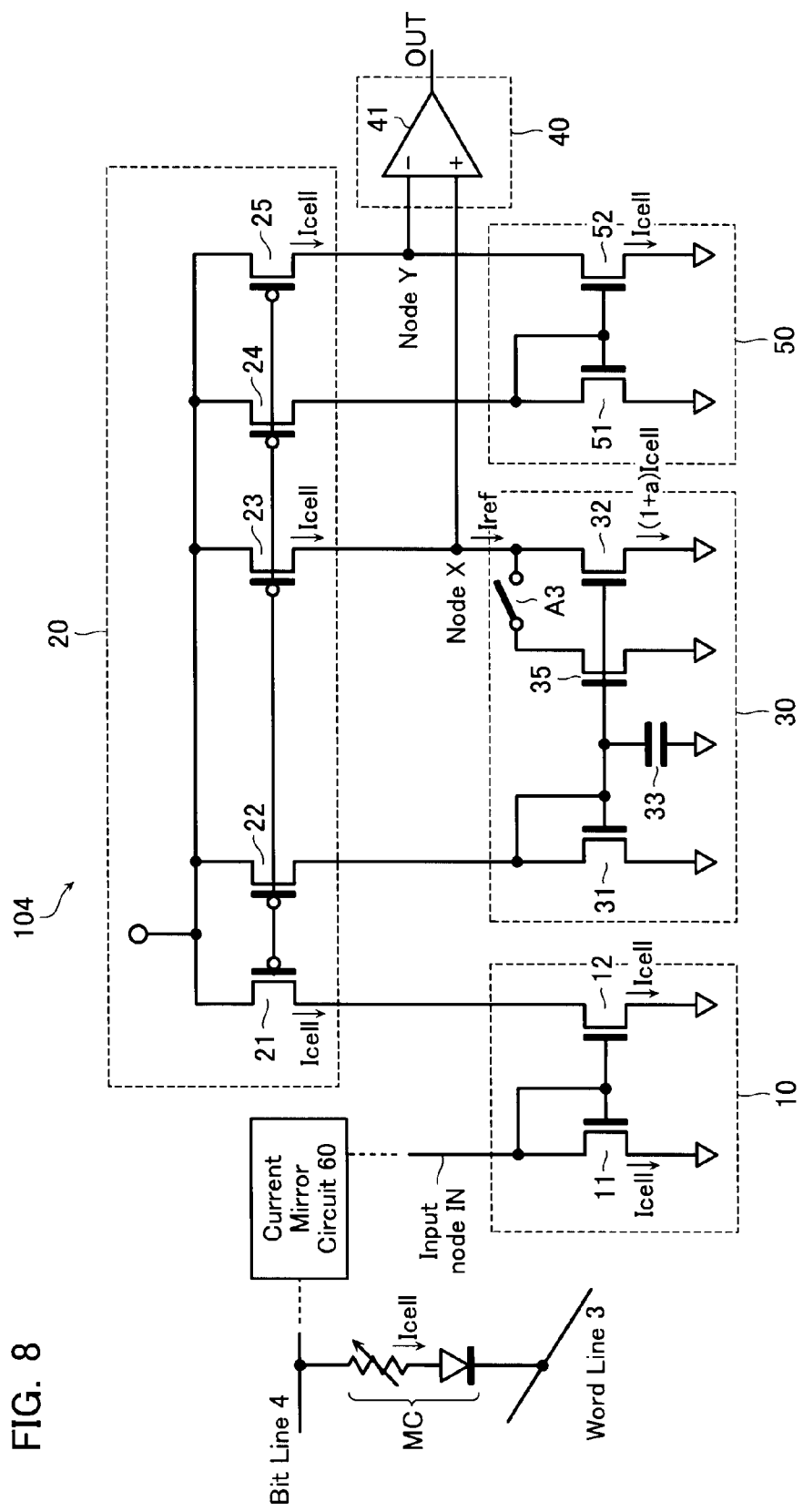
FIG. 8 is a circuit diagram of a control circuit of a semiconductor memory device in accordance with a fourth embodiment.

FIG. 8 is a circuit diagram of a control circuit 104 of the semiconductor memory device in accordance with the present embodiment. In this control circuit 104, identical symbols are assigned to parts having a configuration identical to that in the above-described first embodiment, thereby allowing repetitive description to be omitted.

The control circuit 104 of the semiconductor memory device in accordance with the present embodiment differs from that of the first embodiment in having an NMOS transistor 35 further provided in the reference current generating circuit 30 along with the NMOS transistor 32.

The NMOS transistor 35 has its drain connected to node X via a switch A3, in parallel to the NMOS transistor 32. In addition, the NMOS transistor 35 has its gate connected to the gate of the NMOS transistor 31, commonly with the gate of the NMOS transistor 32, and its source grounded. Opening and closing of the switch A3 is controlled arbitrarily by the control circuit 104. When the switch A3 is closed, the current value of the reference current Iref flowing from node X is determined by the current value of the current flowing in the NMOS transistors 32 and 35. On the other hand, when the switch A3 is open, the current value of the reference current Iref flowing from node X is determined by the current value of the current flowing only in the NMOS transistor 32. In this case, the current value of the reference current Iref generated by the reference current generating circuit 30 is identical to the current value of the reference current Iref generated by the NMOS transistor 32 in the first embodiment. This configuration allows the current value of the reference current Iref at the time it is generated based on the cell current Icell to be changed arbitrarily. This means that a value of a difference dI between the value of the reference current Iref and the value of the cell current Icell in the operation waveform diagram shown in FIG. 6 can be changed.

Advantages of Semiconductor Memory Device in accordance with Fourth Embodiment In the semiconductor memory device of the present embodiment, a reference current Iref appropriate to the selected memory cell MC is generated for each of the selected memory cells MC, thus enabling transition of the resistance state of the selected memory cell MC to be reliably detected, similarly to the first embodiment. It therefore becomes possible for voltage application to the memory cell MC to be suspended along with the resistance state changing, and for the operation to be reliably terminated. Moreover, in the control circuit 104 of the present embodiment, since the current value of the reference current Iref can be made variable, sensitivity to change in the cell current Icell when the resistance state of the selected memory cell MC changes can be altered.

When the current value of the reference current Iref is increased thereby increasing its difference dI with the current value of the cell current Icell, the control circuit 104 continues to execute the operation, even if the cell current Icell flowing in the selected memory cell MC changes to a certain extent. On the other hand, when the current value of the reference current Iref is decreased thereby decreasing its difference dI with the current value of the cell current Icell, the control circuit 104 terminates the operation, even if the cell current Icell changes slightly. As is clear from the above, the semiconductor memory device in accordance with the present embodiment allows sensitivity to change in the cell current Icell when the resistance state of the selected memory cell MC changes to be altered.

This concludes description of embodiments of the present invention, but it should be noted that the present invention is not limited to the above-described embodiments, and that various alterations, additions, substitutions, and so on, are possible within a range not departing from the scope and spirit of the invention. For example, the above-described embodiments are described taking the setting operation as an example, but the semiconductor memory device may also be employed in the resetting operation.

In this case, the transistor size of the NMOS transistor 32 in the reference current generating circuit 30 shown in FIG. 3 is made smaller than the transistor size of the other NMOS transistors 11 and 12, whereby the current value of the reference current Iref is made smaller than the current value of the cell current Icell. For example, the current value of the reference current Iref is set to be (1+a) Icell (here, $-1<a<0$).

Figure 9:
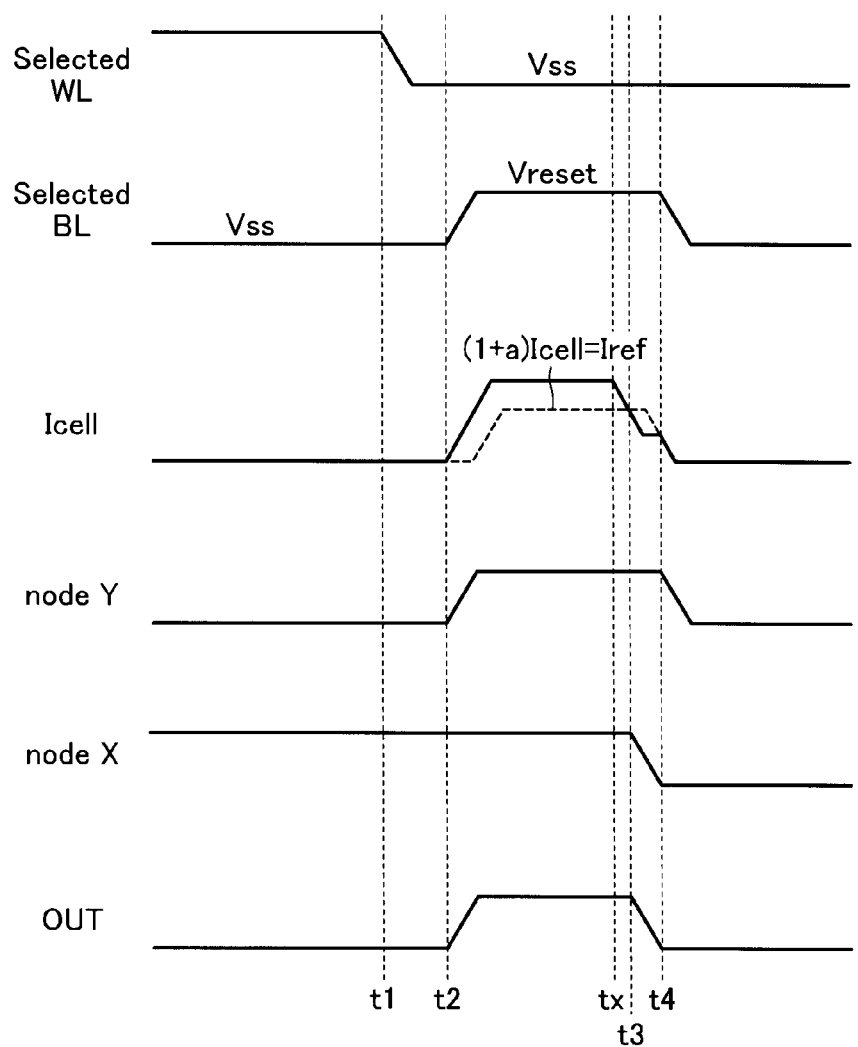
FIG. 9 is an operation waveform diagram of the control circuit of the semiconductor memory device in accordance with the embodiments.

The resetting operation of the semiconductor memory device set in this way is described with reference to FIG. 9. FIG. 9 is a waveform diagram for explaining operation of the semiconductor memory device.

In operation of the semiconductor memory device, first, all word lines are set to "H" state, and then, at time t1, the selected word line 3 connected to the selected memory cell MC is set to "L" state, for example, the voltage Vss.

At time t2, the selected word line 3 is left at "L" state, and the selected bit line 4 is set to "H" state from "L" state (voltage Vss), and applied with a voltage required for the operation (for example, a resetting voltage Vreset). This voltage application to the selected bit line 4 causes the voltage to be applied to the selected memory cell MC in the forward bias direction of the diode 2 and the cell current Icell to flow in the selected memory cell MC.

This cell current Icell causes the capacitor 33 of the reference current generating circuit 30 to be charged, and, after passage of a certain time, the reference current Iref starts to flow in the NMOS transistor 32. As mentioned above, this reference current Iref has a current value smaller than that of the cell current Icell. For example, the current value of the reference current Iref is set to (1+a) times that of the cell current Icell (here, $-1<a<0$). Since the cell current Icell, which is greater than the reference current Iref flowing out of node X via the NMOS transistor 32, is mirrored at node X, node X is boosted to the potential of the power supply used in the current mirror circuit 20. Meanwhile, the cell current Icell flows also into node Y, and node Y is boosted to the potential of the power supply used in the current mirror circuit 20.

When the selected memory cell MC shifts from the low-resistance state to the high-resistance state at time tx due to the resetting operation, the cell current Icell flowing from the selected bit line 4 to the selected word line 3 decreases. Even if the cell current Icell flowing into node X at this time decreases, the current value of the reference current Iref is maintained constant for a certain time until the charge stored in the capacitor 33 is discharged. Consequently, at time t3, the current value of the cell current Icell falls below the current value of the reference current Iref. As a result, the reference current Iref flowing out of node X becomes greater than the cell current Icell flowing into node X, and the potential of node X thus falls to ground potential.

At time t4, along with the change in potential of node X, the output signal OUT of the detecting circuit 40 also inverts. Voltage application to the selected bit line 4 is suspended based on this inverted output signal OUT, whereby the resetting operation terminates.

As is clear from the above, the semiconductor memory device has a reference current Iref appropriate to the selected memory cell MC generated for each of the selected memory cells MC, and thus enables transition of the resistance state of the selected memory cell MC to be reliably detected. It therefore becomes possible for voltage application to the memory cell MC to be suspended along with the resistance state changing, and for the operation to be reliably terminated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a memory cell array having memory cells disposed at intersections of a plurality of first lines and a plurality of second lines, each of the memory cells being configured by a rectifier and a variable resistor connected in series; and
   a control circuit configured to apply a first voltage to a selected one of the first lines and to apply a second voltage having a voltage value smaller than that of the first voltage to a selected one of the second lines, such that a certain potential difference is applied to a selected one of the memory cells disposed at the intersection of the selected one of the first lines and the selected one of the second lines,
   the control circuit comprising:
   a current mirror circuit configured to produce a mirror current having a current value identical to that of a cell current flowing in the selected one of the memory cells;

a reference current generating circuit configured to produce a reference current, the reference current having a current value that differs from the current value of the mirror current by a certain current value, and having a timing of change that is delayed compared with that of the mirror current; and a detecting circuit configured to detect transition of a resistance state of the selected one of the memory cells based on a magnitude relation of the mirror current and the reference current, the control circuit suspending voltage application to the selected one of the first lines and the selected one of the second lines based on a detection result of the detecting circuit.

2. The semiconductor memory device according to claim 1, wherein the reference current generating circuit comprises:

a capacitor charged by the mirror current; and a transistor configured to be turned on when a voltage of an end of the capacitor becomes a third voltage, thereby allowing the reference current to flow therethrough.

3. The semiconductor memory device according to claim 2, wherein the reference current generating circuit comprises a switch configured to block inflow of the mirror current to the capacitor and thereby maintain the current value of the reference current constant.

4. The semiconductor memory device according to claim 2, wherein the capacitor is provided in a plurality in the reference current generating circuit, and the reference current generating circuit is enabled to vary a time that the reference current is delayed by switching the plurality of the capacitors.

5. The semiconductor memory device according to claim 2, wherein the reference current generating circuit comprises:

a plurality of transistors each configured to be turned on when the voltage of the end of the capacitor becomes the third voltage, thereby allowing the reference current to flow therethrough; and a switch configured to switch the plurality of transistors, thereby allowing the current value of the reference current to be changed.

6. The semiconductor memory device according to claim 1, wherein an operation for applying the certain potential difference to the selected one of the memory cells is an operation causing the selected one of the memory cells to shift from a high-resistance state to a low-resistance state, and the current value of the reference current is higher than the current value of the mirror current by a certain current value.

7. The semiconductor memory device according to claim 1, wherein an operation for applying the certain potential difference to the selected one of the memory cells is an operation causing the selected one of the memory cells to shift from a low-resistance state to a high-resistance state, and the current value of the reference current is lower than the current value of the mirror current by a certain current value.

8. A semiconductor memory device, comprising:

a memory cell configured by a rectifier and a variable resistor connected in series; and a control circuit configured to apply a certain voltage to the memory cell and thereby cause a resistance state of the variable resistor to shift, the control circuit comprising:

a current mirror circuit configured to produce a mirror current having a current value identical to that of a cell current flowing in the memory cell;

a reference current generating circuit configured to produce a reference current, the reference current having a current value that differs from the current value of the mirror current by a certain current value, and having a timing of change that is delayed compared with that of the mirror current; and a detecting circuit configured to detect transition of the resistance state of the variable resistor based on a magnitude relation of the mirror current and the reference current.

9. The semiconductor memory device according to claim 8, wherein the reference current generating circuit comprises:

a capacitor charged by the mirror current; and a transistor configured to be turned on when a voltage of an end of the capacitor becomes a certain charging voltage, thereby allowing the reference current to flow therethrough.

10. The semiconductor memory device according to claim 9, wherein the reference current generating circuit comprises a switch configured to block inflow of the mirror current to the capacitor and thereby maintain the current value of the reference current constant.

11. The semiconductor memory device according to claim 9, wherein the capacitor is provided in a plurality in the reference current generating circuit, and the reference current generating circuit is enabled to vary a time that the reference current is delayed by switching the plurality of the capacitors.

12. The semiconductor memory device according to claim 9, wherein the reference current generating circuit comprises:

a plurality of transistors each configured to be turned on when the voltage of the end of the capacitor becomes the charging voltage, thereby allowing the reference current to flow therethrough; and a switch configured to switch the plurality of transistors, thereby allowing the current value of the reference current to be changed.

13. The semiconductor memory device according to claim 8, wherein an operation for applying the certain voltage to the memory cell is an operation causing the memory cell to shift from a high-resistance state to a low-resistance state, and the current value of the reference current is higher than the current value of the mirror current by a certain current value.

14. The semiconductor memory device according to claim 8, wherein an operation for applying the certain voltage to the memory cell is an operation causing the memory cell to shift from a low-resistance state to a high-resistance state, and the current value of the reference current is lower than the current value of the mirror current by a certain current value.

15. A method of operating a semiconductor memory device, comprising:

applying a certain voltage to a memory cell configured by a rectifier and a variable resistor connected in series using a control circuit, thereby causing a resistance state of the variable resistor to shift;

producing a mirror current having a current value identical to that of a cell current flowing in the memory cell using a current mirror circuit;

producing a reference current using a reference current generating circuit, the reference current having a current value that differs from the current value of the mirror current by a certain current value, and having a timing of change that is delayed compared with that of the mirror current; and detecting transition of the resistance state of the variable resistor based on a magnitude relation of the mirror current and the reference current using a detecting circuit.

16. The method of operating a semiconductor memory device according to claim 15, further comprising:

suspending voltage application to the memory cell based on a detection result of the detecting circuit using the control circuit.

17. The method of operating a semiconductor memory device according to claim 15, wherein the reference current generating circuit comprises a capacitor charged by the mirror current and a transistor connected to an end of the capacitor, and comprising:

causing the transistor to be turned on when a voltage of the end of the capacitor becomes a certain charging voltage, thereby allowing the reference current to flow therethrough.

18. The method of operating a semiconductor memory device according to claim 17, comprising:

blocking inflow of the mirror current to the capacitor using the reference current generating circuit, thereby maintaining the current value of the reference current constant.

19. The method of operating a semiconductor memory device according to claim 17, wherein the capacitor is provided in plurality in the reference current generating circuit, and comprising:

varying a time that the reference current is delayed by switching a plurality of the capacitors using the reference current generating circuit.

20. The method of operating a semiconductor memory device according to claim 17, wherein the reference current generating circuit comprises a plurality of transistors each configured to be turned on when the voltage of the end of the capacitor becomes the charging voltage, thereby allowing the reference current to flow therethrough, and comprising:

changing the current value of the reference current by switching the plurality of transistors using the reference current generating circuit.

* * * * *